United States Patent

Park

[11] Patent Number: 6,147,926
[45] Date of Patent: Nov. 14, 2000

[54] SEMICONDUCTOR MEMORY DEVICE

[75] Inventor: Boo Yong Park, Seoul, Rep. of Korea

[73] Assignee: LG Semicon Co., Ltd., Chungcheongbuk-do, Rep. of Korea

[21] Appl. No.: 09/318,838

[22] Filed: May 26, 1999

[30] Foreign Application Priority Data

Dec. 29, 1998 [KR] Rep. of Korea ............... 98-60417

[51] Int. Cl.$^7$ .................................................. G11C 8/00
[52] U.S. Cl. .................. 365/233; 365/189.05; 365/221; 365/236
[58] Field of Search .............................. 365/233, 189.05, 365/189.02, 230.02, 221, 236

[56] References Cited

U.S. PATENT DOCUMENTS

| | | | |
|---|---|---|---|
| 5,402,388 | 3/1995 | Wojcicki et al. | 365/233 |
| 5,655,105 | 8/1997 | McLaury | 395/496 |
| 5,867,447 | 2/1999 | Koshikawa | 365/189.05 |
| 5,883,855 | 3/1999 | Fujita | 365/221 X |
| 5,959,900 | 9/1999 | Matsubara | 365/233 |

*Primary Examiner*—Huan Hoang
*Attorney, Agent, or Firm*—Morgan, Lewis & Bockius LLP

[57] ABSTRACT

Semiconductor memory device which can support a DDR SDRAM latency mode like 2.5 for easy application to a high data rate memory, including a memory cell array having a plurality of memory cell regions for storing external data and forwarding the data on two lines by a decoded column address, a data path unit for forwarding the data from the memory cell array received through the two lines outwardly synchronous to an edge of internal clock, a controlling unit for controlling the data path unit entirely, a FIFO unit for controlling a forwarding order of the two data received from the data path unit, a latency pipeline controlling unit for providing an Enable signal for setting a data output enable interval at each of the control unit and the data path unit, a clock generating unit for providing the internal clock to the FIFO unit, the data path unit and the latency pipeline controlling unit for obtaining a desired band width, and a burst counter for providing a read signal having information on a burst length to the FIFO unit and the latency pipeline control unit.

10 Claims, 9 Drawing Sheets

SEMICONDUCTOR MEMORY DEVICE

BACKGROUND OF THE INVENTION

1. Field of the Invention

The present invention relates to a semiconductor memory device, and more particularly, to a semiconductor memory device applicable to a high data rate memory with easy.

2. Background of the Related Art

As a system operation frequency of the semiconductor memory device becomes the higher, a performance of the semiconductor memory device becomes the higher, too. However, DRAMs (Dynamic Random Access Memories) which occupy most of main memories still have a significant difference in view of performance from CPUs (Central Processing Unit), to overcome which a DRAM in which a data band width can be improved under the same operation frequency is under development. In general, being a reference for determining a performance of a memory, the data band width represents an amount of data the memory can access for one second. For example, for a memory operative synchronous to a system operation frequency of 100 MHZ, the data band width per pin of the memory is 100 Mbps (Mbits/sec). The data band width can be improved, simply by increasing the system operation frequency, or either by operating an internal operating frequency two times or four times of the system operating frequency while keeping the system operating frequency the same, with data reading or writing at a rising edge of the operating frequency or by synchronizing the data to a rising and a falling edges of a system clock. In the latter method, the data band width per pin of memory can be 200 Mbps or 400 Mbps. Alike a general SDRAM, a DDR SDRAM (Double Data Rate Synchronous DRAM) has a number of CAS latency modes (CL) (Column Address Select Signal Latency Mode). For example, in CL2, data is available after two system clock cycles from a read command, in CL2.5, data is available after 2.5 system clock cycles, and in CL3, after 3 system clock cycles. There are such different CL modes, for allowing a user to use the SDRAM in different frequencies by allowing the user to determine a CL mode such that, because a time required for a read command in an SDRAM, i.e., a time period tAA required from a column address latch to a first data output is nothing to do with the frequency, the tAA is allowed regardless of the system operation frequency. Therefore, a latency control circuit is required for operating at a fixed CL according to an employed operating frequency.

Referring to FIG. 1, a related art SDR (Single Data Rate) SDRAM, disclosed in U.S. Pat. No. 5,655,105, is provided with a memory array 101, a controlling unit 102, a data bus 105, an address bus 106, an I/O (input output) interface 110, an address register 112 for receiving a row or a column address through the address bus 106 and clocking the received address, a row address path 114 for providing the row address to the memory array 101, a column address path 116 for providing the column address to the memory array 101, an input data path 240 for providing a data from the data bus 105 to the I/O interface 110, an output data path 242 for providing a data from the I/O interface 110 to the data bus 105, and a mask register. The controlling unit 102 has a system clock signal CLK, a clock enable signal CKE, a mode register 150 for generating a latency mode, a command decoder, a latency controller 136. There are a plurality of command signals provided to the command decoder, including a chip selection signal CSB for controlling read/write on the SDRAM, a write enable signal WEB, a column address selection signal CASB, a row address selection signal RASB, and a block write selection signal DSF. The row address path 114 is provided with a row address multiplexer 118 for receiving a row address from the address register 112, a refresh unit 120 for providing a refresh signal to the row address multiplexer 118 to support maintaining an enable of a row, a row latch 122 for receiving an output from the row address multiplexer 118, and a row decoder 124 for receiving an output from the row latch 122 and connected to the memory array 101 to have one 8 bit address. The column address path 116 is provided with a column address latch 128 for receiving a column address from the address register 112 and holding the column address, a burst counter 130 for receiving an output from the column address latch 128, a column address buffer 132 for being driven by the burst counter 130, and a column decoder 134 for storage of 8 bit column addresses of the column address buffer 132 and enabled memory array 101. And, the I/O interface 110 is enabled by a column address on the same with the column decoder 134, the burst counter 130 passes the column address without any change when the multiple latency SDRAM is not in a block write mode, passes the address immediately in a latency 2 operation, and passes a delayed address in a latency 3 operation. The input data path 240 is provided with a master data input register 246 for receiving a data from the data bus 105 and clocking the data by a DINL, a data-in latch command, a first, and a second slaves 250 and 252 for receiving an output from the master data input register 246 and clocking the same by a master-slave write path signal M-S WRITEPASS from the latency controlling unit 136, and a color 254 for receiving an output from the master data input register 246, and a multiplexer 266 for receiving outputs from the first, and second slaves 250 and 252 and the color 254. And, the output data path 242 has a master input register, a by-pass, and a data output register.

However, the related semiconductor memory device of SDR SDRAM has the following problems.

First, the latency modes of 2 or 3 can not support a DDR SDRAM latency mode like latency 2.5 in which read/write is synchronized to both side edges of the system clock, i.e., a data read is carried out in a half cycle of the system clock.

Second, because the frequency is fixed to an optimal frequency, the circuit should be modified every time an employed frequency is changed for providing an additional control signal for operating a desired latency mode even if the frequency has changed.

SUMMARY OF THE INVENTION

Accordingly, the present invention is directed to a semiconductor memory device that substantially obviates one or more of the problems due to limitations and disadvantages of the related art.

An object of the present invention is to provide a semiconductor memory device which can support a DDR SDRAM latency mode like 2.5 for easy application to a high data rate memory.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor memory device includes a memory cell array having a plurality of memory cell regions for storing external data and forwarding the data on two lines by a decoded column address, a data path unit for forwarding the data from the memory cell array received through the two lines outwardly synchronous to an edge of internal clock, a controlling unit for controlling the data path unit entirely, a FIFO unit for controlling a forwarding order of the two data received from the data path unit, a latency pipeline controlling unit for providing an Enable signal for setting a data output enable interval at each of the control unit and the data path unit, a clock generating unit for providing the internal clock to the FIFO unit, the data path unit and the latency pipeline controlling unit for obtaining a desired band width, and a burst counter for providing a read signal having information on a burst length to the FIFO unit and the latency pipeline control unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
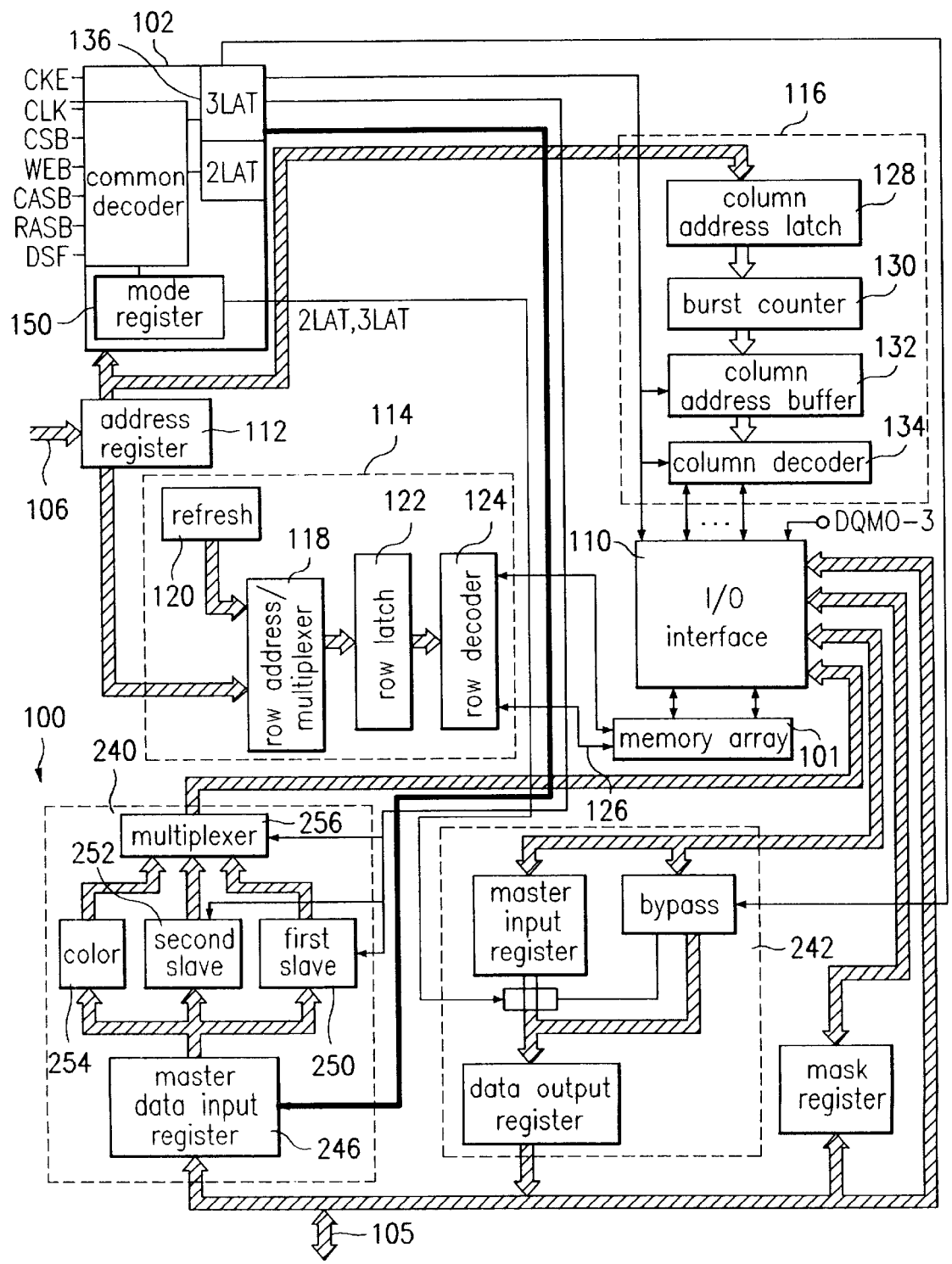
FIG. 1 illustrates a block diagram showing a related art SDR SDRAM.
Figure 2:
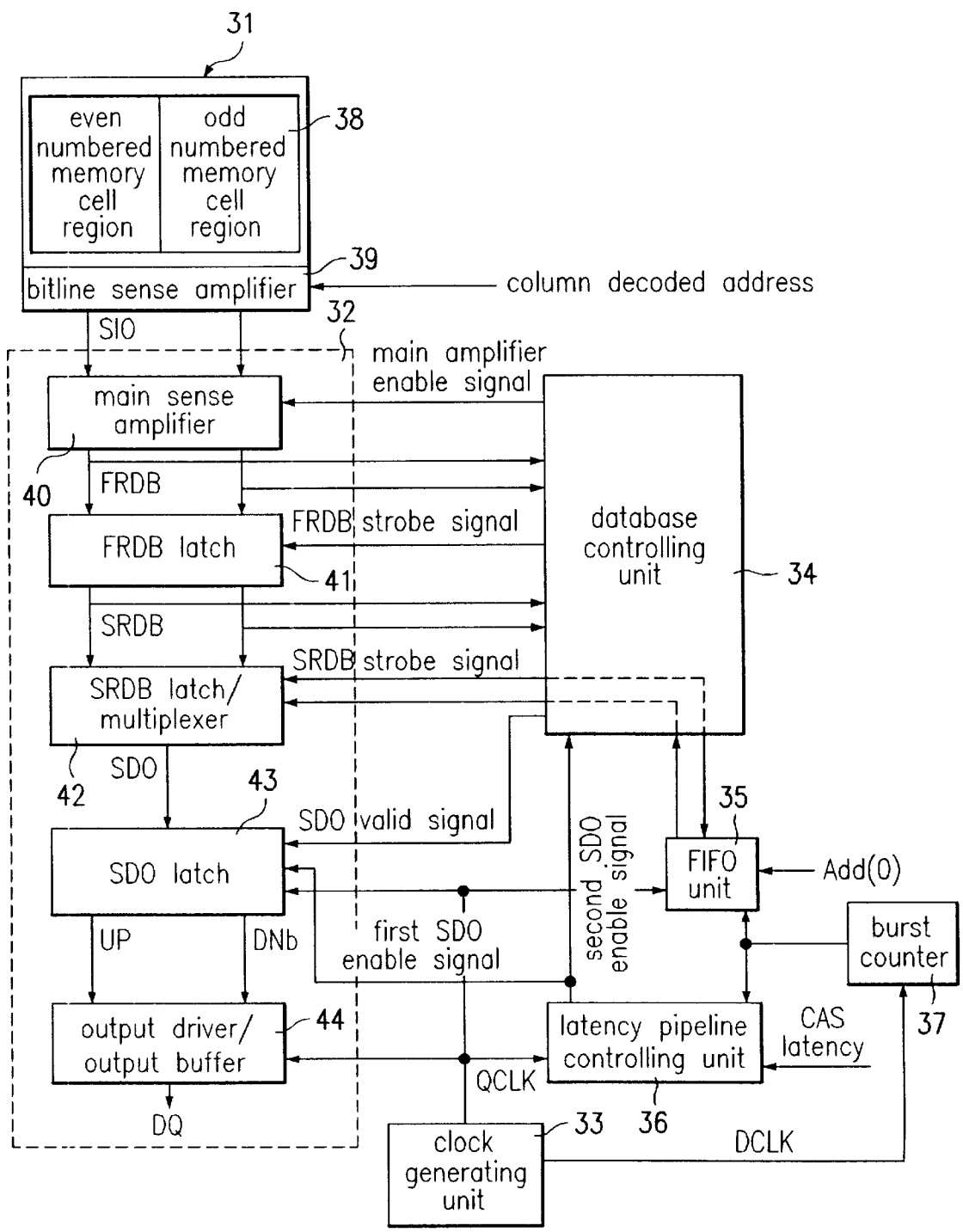
FIG. 2 illustrates a block diagram showing an DDR SDRAM in accordance with a preferred embodiment of the present invention.
Figure 3:
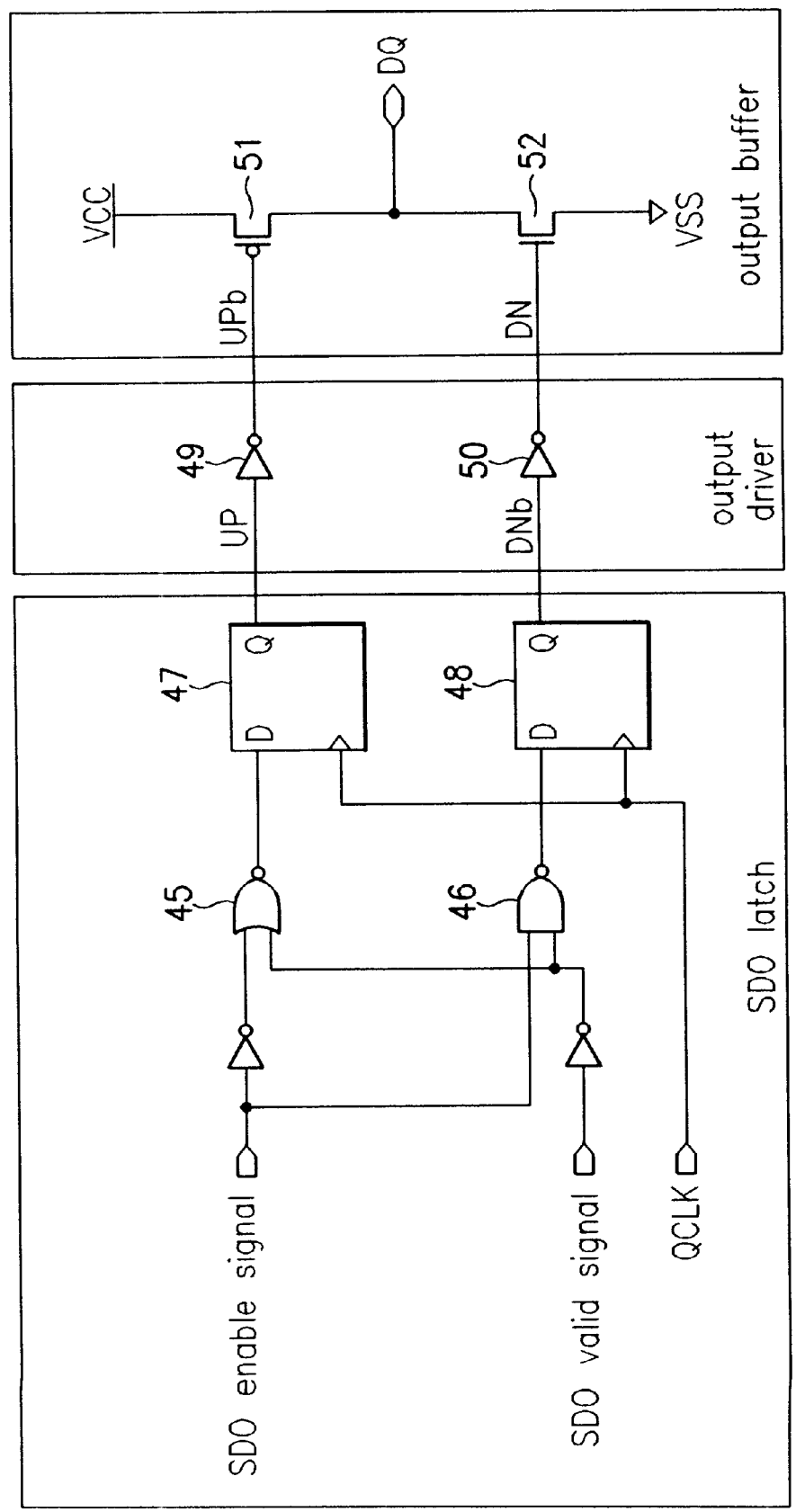
FIG. 3 illustrates a circuit showing an Latch, an output driver/output buffer in the DDR SDRAM in a preferred embodiment of the present invention.
Figure 4:
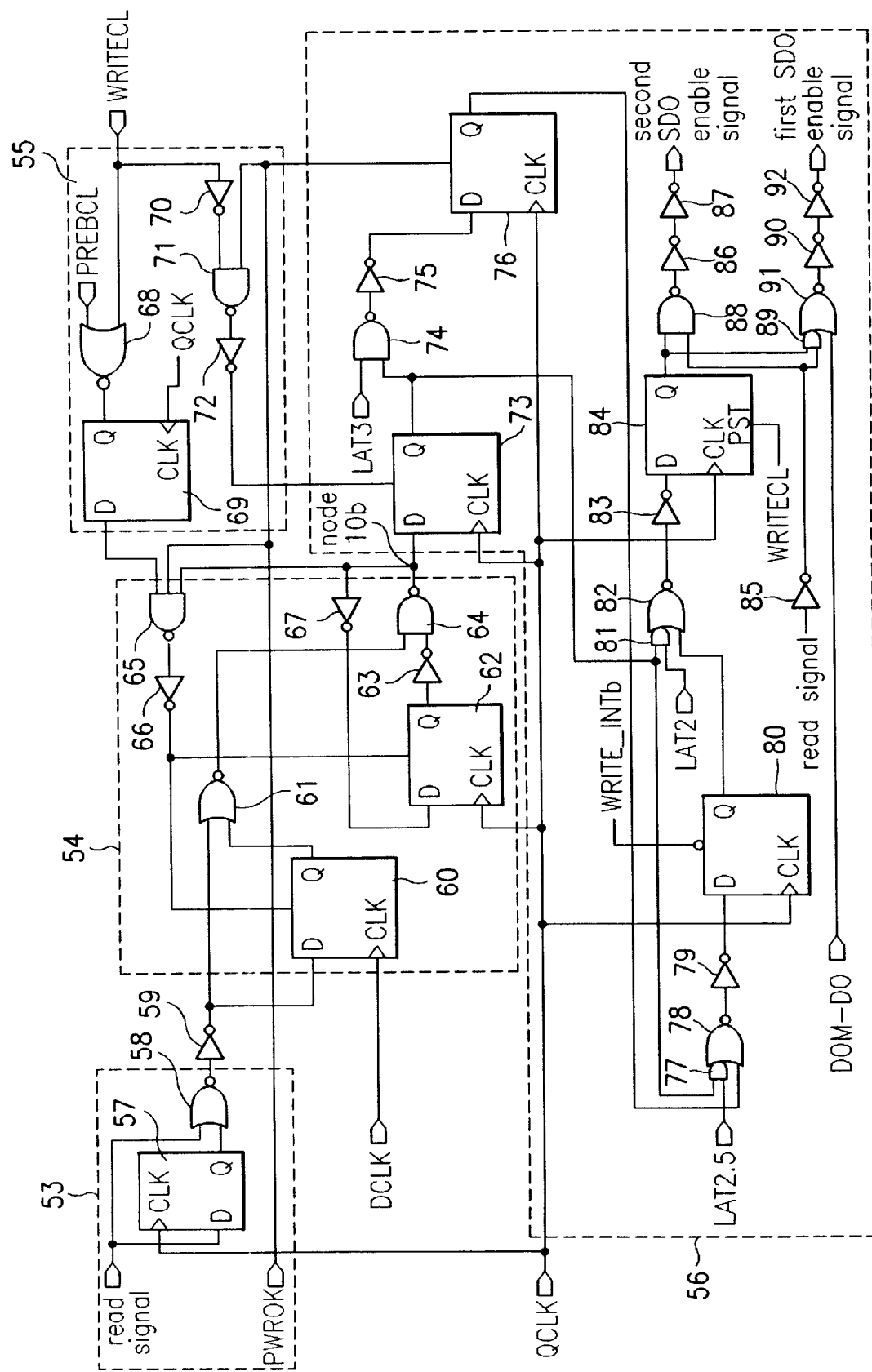
FIG. 4 illustrates a circuit showing a latency pipeline controlling unit in the DDR SDRAM in a preferred embodiment of the present invention.
Figure 5:
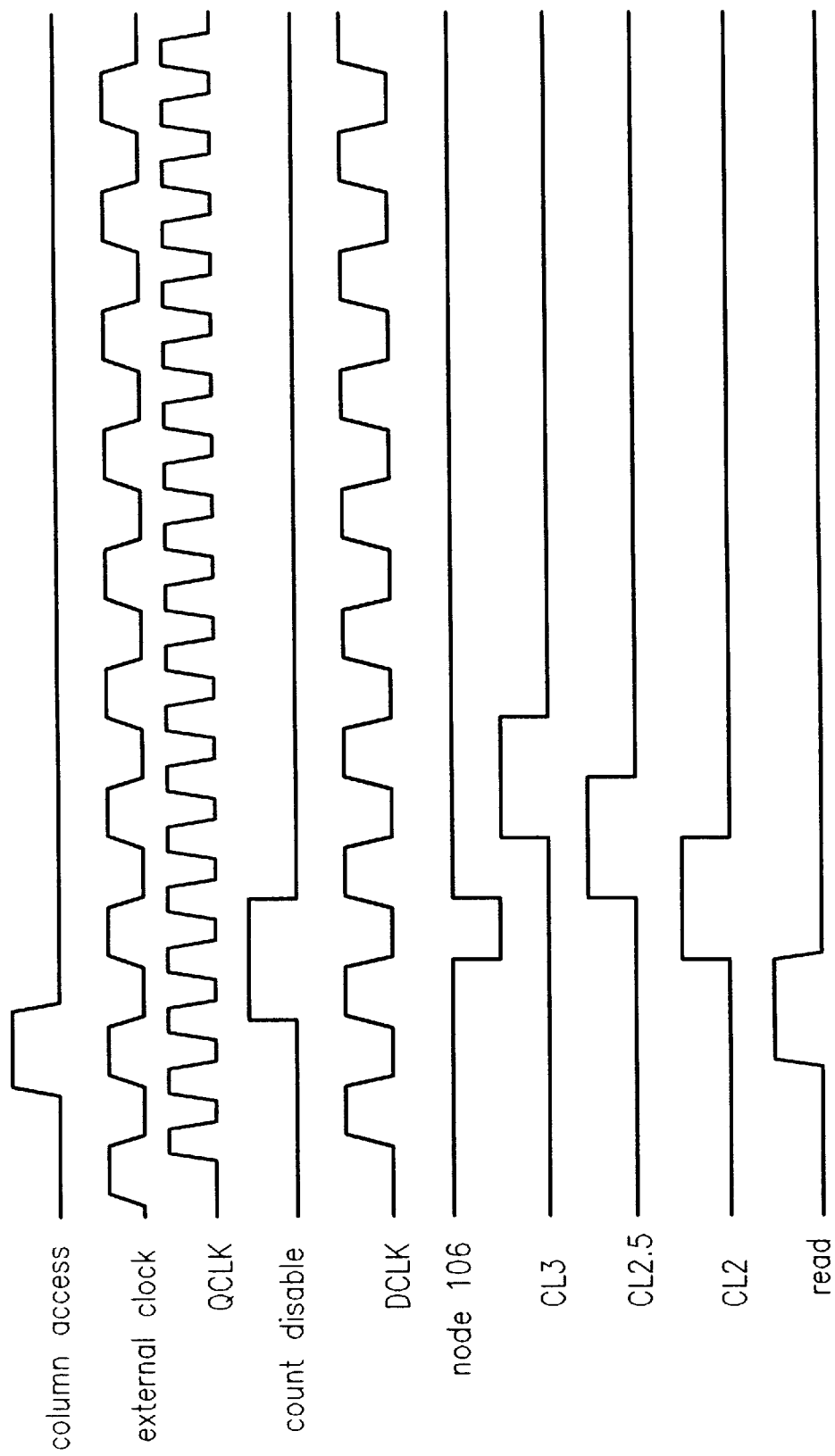
FIG. 5 illustrates a pulse diagram illustrating respective read operations of CL2, CL2.5, and CL3 when a burst has a length of 2 in a DDR SDRAM in a preferred embodiment of the present invention.
Figure 6:
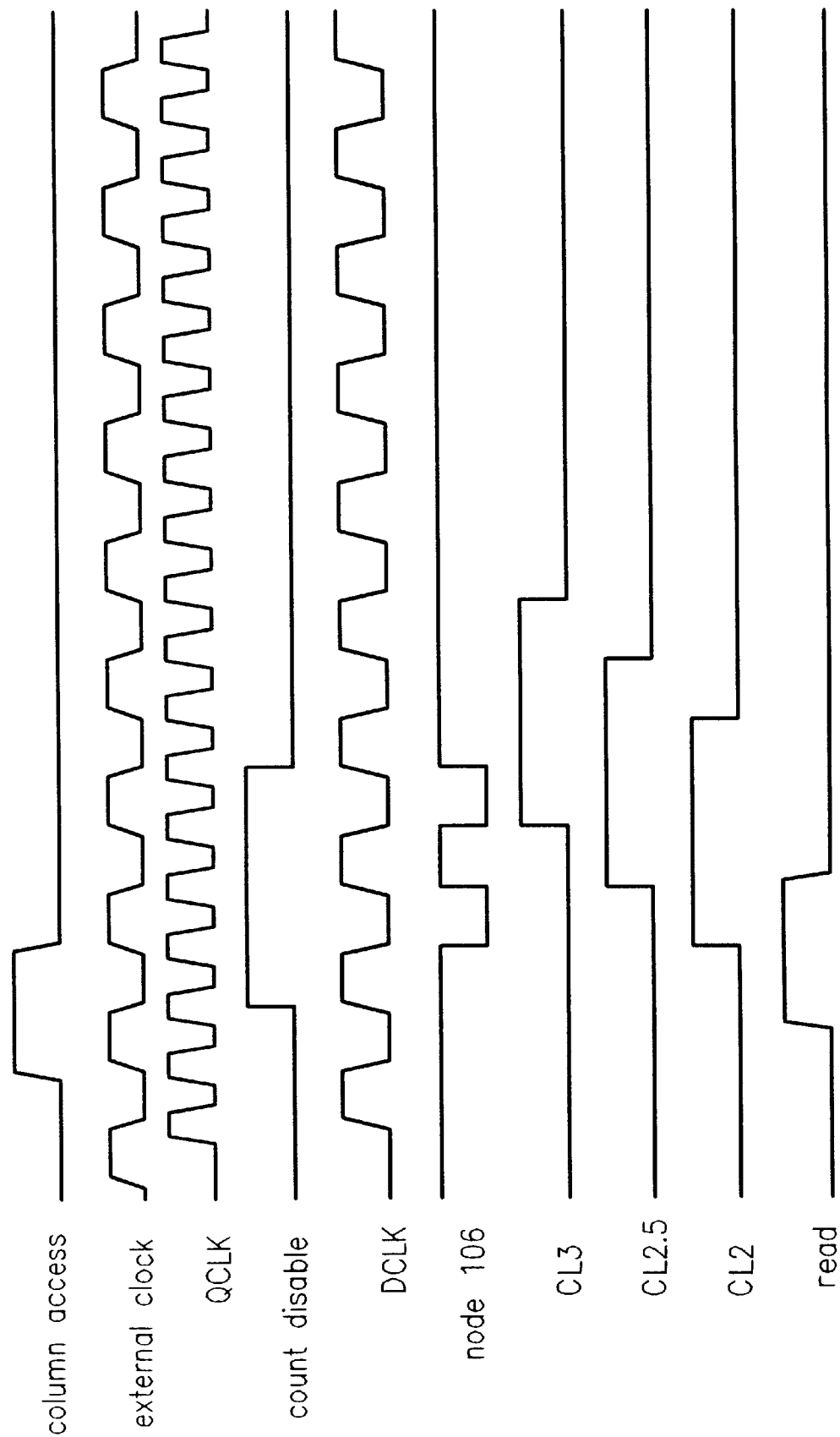
FIG. 6 illustrates a pulse diagram illustrating respective read operations of CL2, CL2.5, and CL3 when a burst has a length of 4 in a DDR SDRAM in a preferred embodiment of the present invention.
Figure 7:
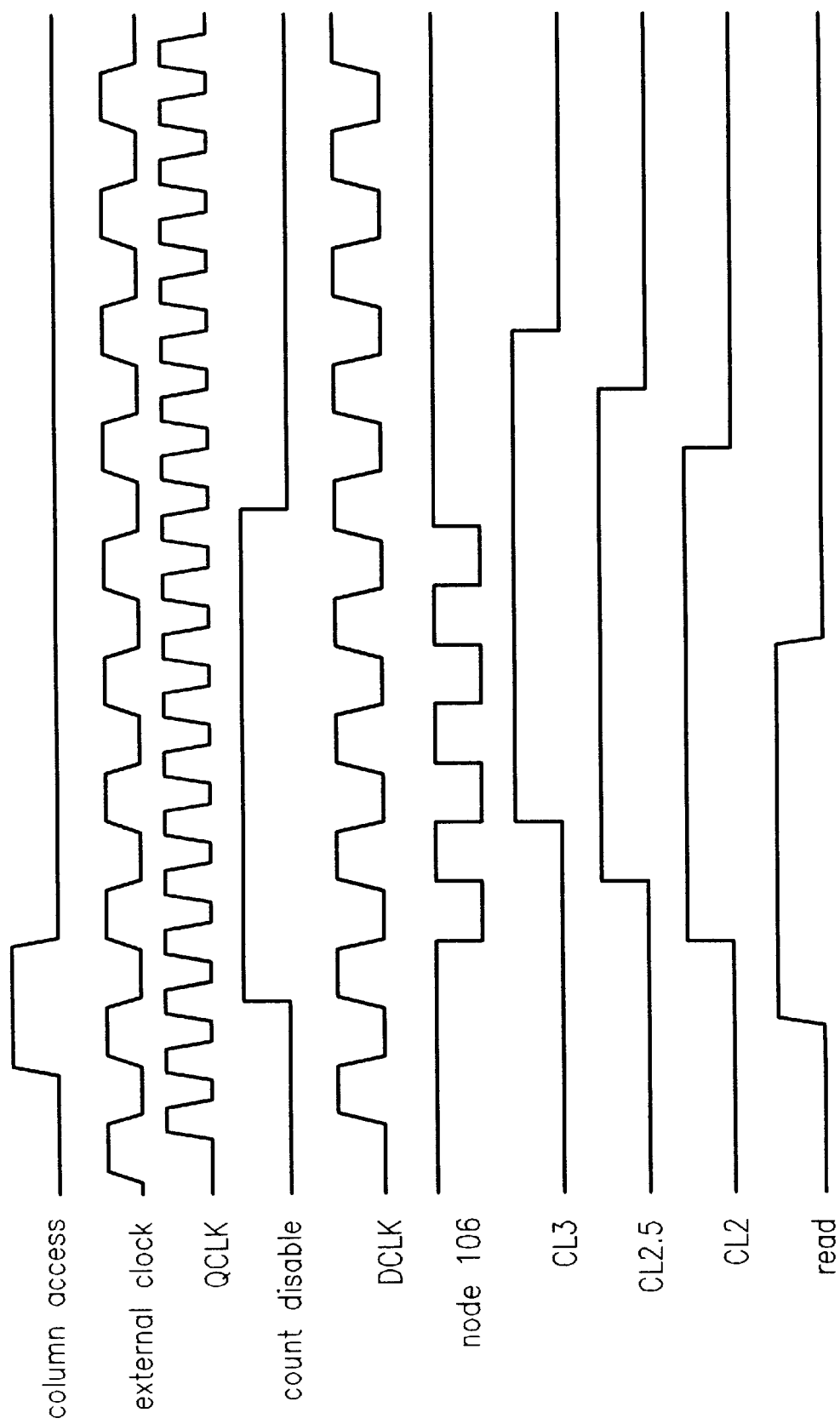
FIG. 7 illustrates a pulse diagram illustrating respective read operations of CL2, CL2.5, and CL3 when a burst has a length of 8 in a DDR SDRAM in a preferred embodiment of the present invention.
Figure 8:
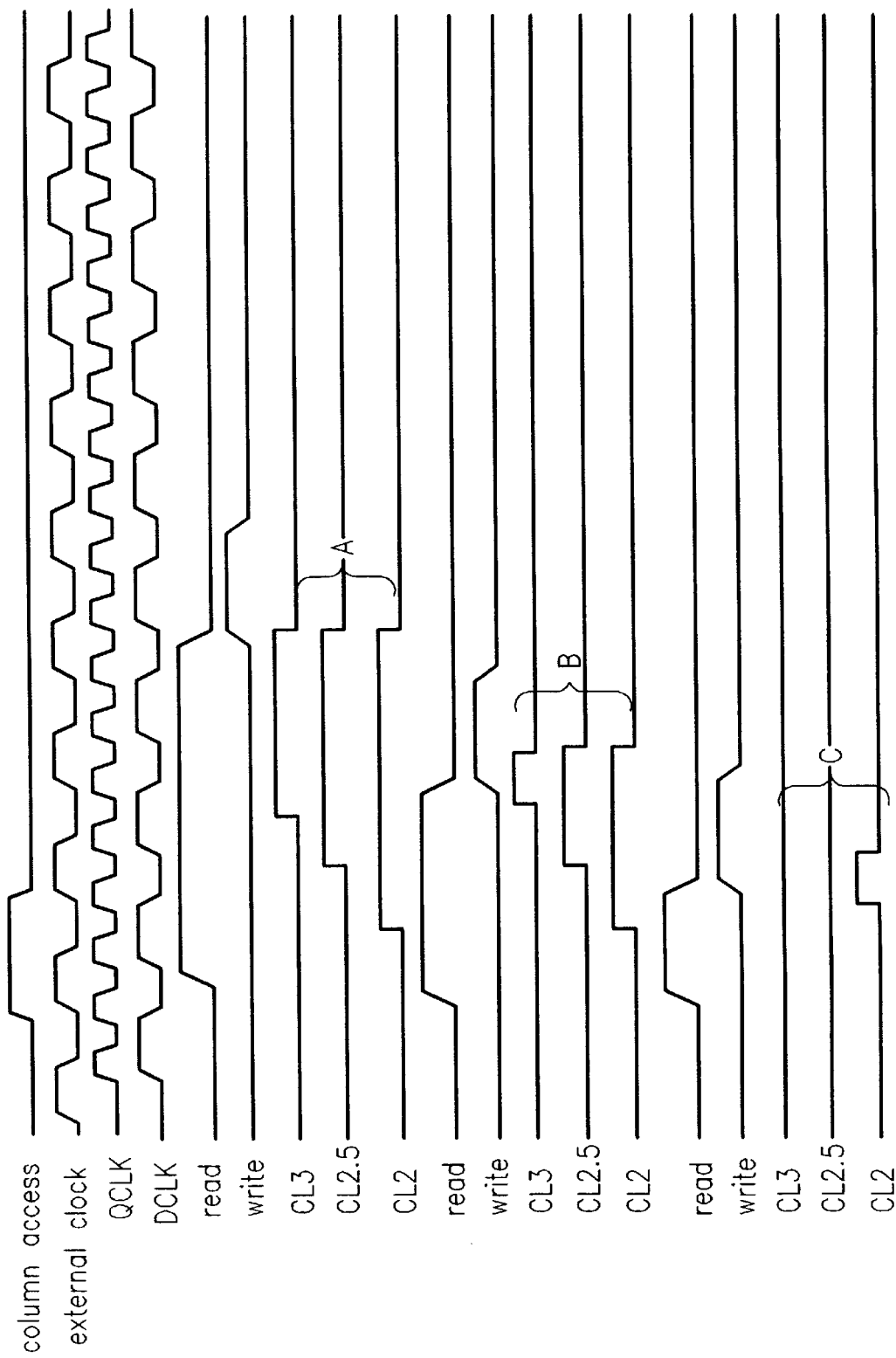
FIG. 8 illustrates a pulse diagram illustrating when respective read operations of CL2, CL2.5, and CL3 in a DDR SDRAM in a preferred embodiment of the present invention are stopped by write commands; and, FIG. 9 illustrates a pulse diagram illustrating when respective read operations of CL2, CL2.5, and CL3 in a DDR SDRAM in a preferred embodiment of the present invention are stopped by precharge commands.
Figure 9:
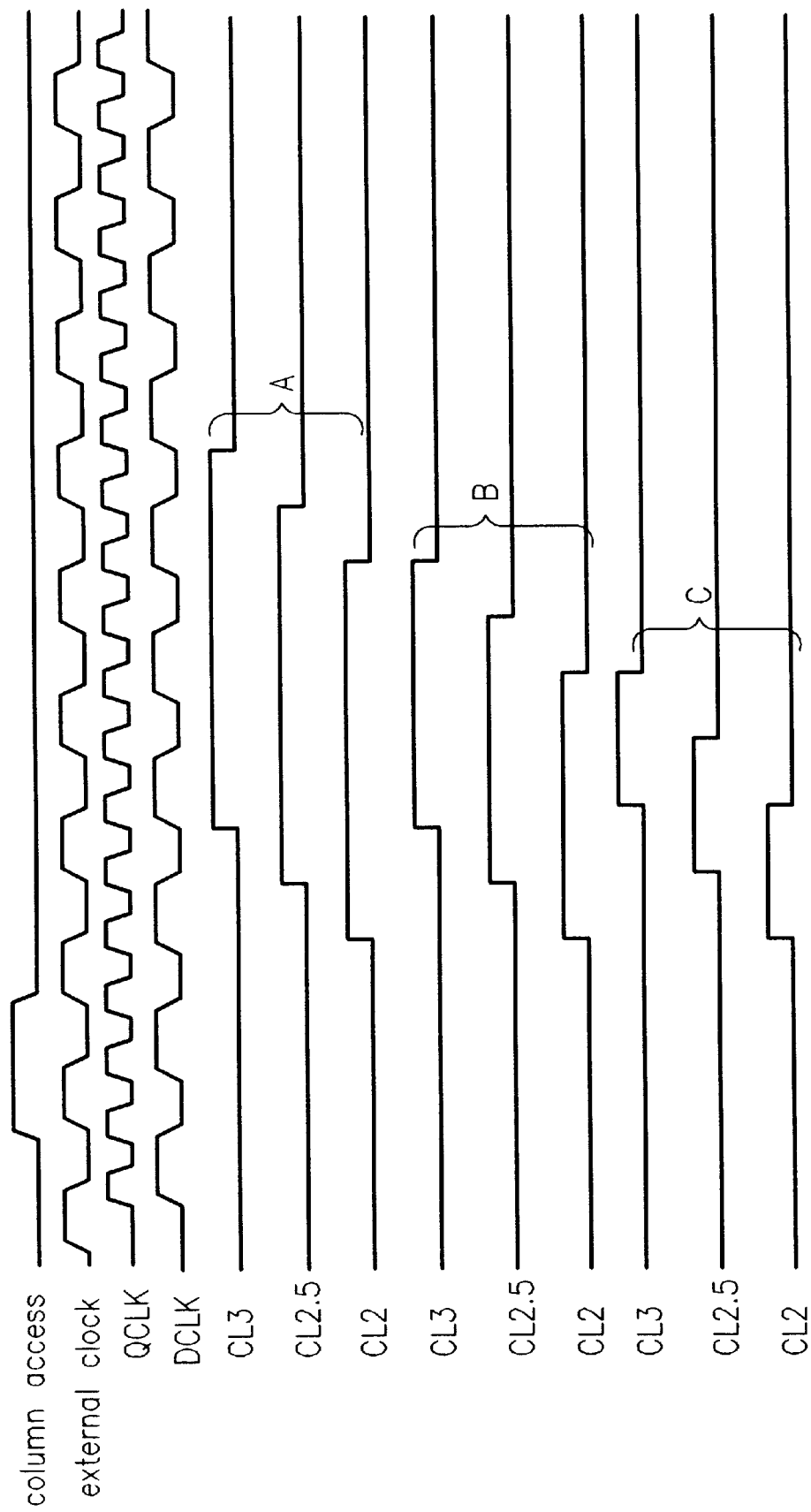

Reference will now be made in detail to the preferred embodiments of the present invention, examples of which are illustrated in the accompanying drawings. FIG. 2 illustrates a block diagram showing an DDR SDRAM in accordance with a preferred embodiment of the present invention, FIG. 3 illustrates a circuit showing an Latch, an output driver/output buffer in the DDR SDRAM in a preferred embodiment of the present invention, and FIG. 4 illustrates a circuit showing a latency pipeline controlling unit in the DDR SDRAM in a preferred embodiment of the present invention. And, FIG. 5 illustrates a pulse diagram illustrating respective read operations of CL2, CL2.5, and CL3 when a bus has a length of 2 in a DDR SDRAM in a preferred embodiment of the present invention, FIG. 6 illustrates a pulse diagram illustrating respective read operations of CL2, CL2.5, and CL3 when a bus has a length of 4 in a DDR SDRAM in a preferred embodiment of the present invention, and FIG. 7 illustrates a pulse diagram illustrating respective read operations of CL2, CL2.5, and CL3 when a bus has a length of 8 in a DDR SDRAM in a preferred embodiment of the present invention. And, FIG. 8 illustrates a pulse diagram illustrating when respective read operations of CL2, CL2.5, and CL3 in a DDR SDRAM in a preferred embodiment of the present invention are stopped by write commands, and FIG. 9 illustrates a pulse diagram illustrating when respective read operations of CL2, CL2.5, and CL3 in a DDR SDRAM in a preferred embodiment of the present invention are stopped by precharge commands.

Referring to FIG. 2, the DDR SDRAM in accordance with a preferred embodiment of the present invention includes a column decoded address, a memory cell array 31, a data path 32, a clock generating unit 33, a database controlling unit 34, an FIFO (First-in first-out) unit 35, a latency pipeline controlling unit 36, and a burst counter unit 37. The memory cell array 31 has even/odd numbered memory cell regions 38 and a bit line sense amplifier 39 for receiving the column decoded address. The data path 32 includes a main sense amplifier 40 for receiving a data from the bit line sense amplifier 39 and a main amplifier enable signal from the database controlling unit 34 to amplify data from the bit line sense amplifier 39, an FRDB latch 41 for receiving a data from the main sense amplifier 40 and an FRDB (First Read Data Bus) strobe signal to store the data from the main sense amplifier 40, an SRDB latch/multiplexer 42 for receiving a data from the FRDB latch 41, an SRDB (Second Read Data Bus) strobe signal from the database controlling unit 34, and the even/odd numbered signals from the FIFO unit 35, an Latch 43 disposed on a data pad side for receiving a data from the SRDB latch/multiplexer 42, an SDO (Serial Data Out) valid signal from the database controlling unit 34, a first Enable signal from the latency pipeline controlling unit 36, and an output sync clock QCLK from the clock generating unit 33, and an output driver/output buffer 44 for receiving an UP, and DNb (Down bar) from the Latch 43 and QCLK from the clock generating unit 33 and providing a data DQ which is the UP, and DNb synchronized to an edge of the QCLK to outside of the DDR SDRAM through one line. A number of each of the FRDB latch 41, the SRDB latch/multiplexer 42, the Latch 43, the output driver/output buffer 44 is the same with respective pads. The FIFO unit 35 is controlled by an address 0 Add <0>, and the burst counter unit 37 provides a read signal having information on a burst length to the FIFO unit 35 and the latency pipeline controlling unit 36. Then, the clock generating unit 33 generates a QCLK having a frequency two times of the system clock frequency in the data path for obtaining a two times of data band width.

And, the Latch 43 and the output driver/output buffer 44 have systems as shown in FIG. 3. That is, the Latch 43 includes a first NOR gate for receiving an inverted first Enable signal and an inverted SDO valid signal, a first NAND gate 46 for receiving the first Enable signal and an inverted SDO valid signal, a first flipflop 47 for receiving an output from the first NOR gate 45 and a QCLK, and a second flipflop 48 for receiving an output from the first NAND gate 46 and the QCLK. In the output driver/output buffer 44, the output driver includes a first inverter 49 for inverting an UP from the first flipflop 47 and a second inverter 50 for inverting a DNb from the second flipflop 48, and the output buffer includes a first PMOS 51 having a gate connected to an UPb from the first inverter 49 and a source connected to a power source VCC and a first NMOS 52 having a gate connected to a DN from the second inverter 50, a source connected to a ground voltage VSS, and a drain connected to a drain of the first PMOS 51, wherein an output is provided out of the output buffer through a common drain of the first PMOS 51 and the first NMOS 52.

Referring to FIG. 4, the latency pipeline controlling unit 36 includes a QCLK sync unit 53 for receiving a read signal having information on a burst length from the burst counter unit 37 and synchronizing to the QCLK for following a burst operation, a counter unit 54 for fixing intervals of a first and a second Enable signals, a resetting unit 55 for disabling a read command when a read operation is stopped by a write command or a precharge command in the middle of the read command for reading the first, and second Enable signals, a pipe unit 56 for receiving a latency mode and determining a start of the first, and second Enable signals according to a fixed mode. The QCLK sync unit 53 includes a third flipflop 57 for receiving a read signal, an Internal power normal signal indicating internal power normal, and a QCLK and a second NOR gate 58 for receiving the read signal and an output from third flipflop 57. The counter unit 54 includes a fourth flipflop 60 for receiving an output from the second NOR gate 58 inverted by the third inverter 59 and a DCLK, a third NOR gate 61 for receiving an output from the second NOR gate 58 inverted by the third inverter 59 and an output from the fourth flipflop 60, a fifth flipflop 62 for receiving the QCLK, a second NAND gate 64 for receiving an output from the third NOR gate 61 and an output from the fifth flipflop 62 inverted by the fourth inverter 63, and a third NAND gate 65 for receiving an output from the second NAND gate 64 and the Internal power normal signal. In this instance, the fourth flipflop 60 also receives an output from the third NAND gate 65 inverted by the fifth inverter 66, and the fifth flipflop 62 also receives an output from the third NAND gate 65 inverted by the fifth inverter 66 and an output from the second NAND gate 64 inverted by the sixth inverter 67. And, the resetting unit 55 includes a fourth NOR gate 68 for receiving a PREBSCL, a precharging signal, and a WRITECL, a write signal, a sixth flipflop 69 for receiving an output from the fourth NOR gate 68 and the QCLK, and a fourth NAND gate 71 for receiving the Internal power normal signal and the WRITECL inverted by the seventh inverter 70. And, the pipe unit 56 includes a seventh flipflop 73 for receiving the QCLK, an output from the second NAND gate 64, and an output from the fourth NAND gate 71 inverted by the eighth inverter 72, a fifth NAND gate 74 for receiving an output from the seventh flipflop 73 and the CL3, an eighth flipflop 76 for receiving the QCLK, the Internal power normal signal, and an output form the fifth NAND gate 74 inverted by the ninth inverter 75, a first AND gate 77 for receiving an output from the seventh flipflop 73 and the CL2.5, a fifth NOR gate 78 for receiving an output from the first AND gate 77 and an output from the eighth flipflop 76, a ninth flipflop 80 for receiving the QCLK, WRITE_INTb, and an output from the fifth NOR gate 78 inverted by the tenth inverter 79, a second AND gate 81 for receiving an output from the seventh flipflop 73 and the CL2, a sixth NOR gate 82 for receiving an output from the second AND gate 81 and an output from the ninth flipflop 80, a tenth flipflop 84 for receiving the QCLK, WRITECL, and an output from the sixth NOR gate 82 inverted by the eleventh inverter 83, a sixth NAND gate 88 for receiving an output from the tenth flipflop 84 and a read signal inverted by the twelfth inverter 85 and forwarding a second Enable signal to outside through a thirteenth and fourteenth inverter 86 and 87, a third AND gate 89 for receiving an output from the tenth flipflop 84 and a read signal inverted by the twelfth inverter 85, and a seventh NOR gate 91 for receiving an output from the third AND gate 89 and a DQM_DO, a signal for selectively masking a data the user want, and forwarding a first Enable signal to outside through a fifteenth and sixteenth inverters 90 and 92.

The operation of the aforementioned DDR SDRAM in accordance with a preferred embodiment of the present invention will be explained. The present invention is related to an art for controlling latency of a DDR SDRAM, allowing to support different latency modes, is provided with even/odd numbered memory cell regions in a memory cell array for facilitating a write operation two times faster than a system operation frequency.

An address signal received from outside of the DDR SDRAM in response to a write command is provided to the memory cell array 31 through the column address path.

Then, the bit line sense amplifier 39 in the memory cell array 31 reads data on the even/odd numbered memory cell array regions 38, and provides to the main sense amplifier 40 through SIO (Serial I/O interface by the column decoded address. In this instance, data each with a length half of a preset burst length are provided to respective paths in response to column selection signals. If the burst length is 4, the column selection signal is enabled two times, to provide data to the even and odd SIOs in succession. Then, the main sense amplifier 40 provides the data from the SIO to the database controlling unit 34 and the FRDB latch 41 in response to a main amplifier enable signal from the database controlling unit 34. In this instance, the main amplifier enable signal is provided by delaying a column selection signal taking a data delay at the bit line sense amplifier and the DB line. And, the database controlling unit 34 receives the FRDB bit by bit and provides the main amplifier enable signal only when the FRDB is precharged. Then, the FRDB latch 41 provides a data of FRDB to the database controlling unit 34 and the SRDB latch/multiplexer 42 in response to an FRDB strobe signal from the database controlling unit 34, and the database controlling unit 34 provides an FRDB strobe signal when an SRDB is precharged upon reception of an SRDB data bit by bit. In this instance, the FRDB latch 41 provides the data only when the FRDB strobe signal is received from the database controlling unit 34, and stores the data in other cases. And, the SRDB latch/multiplexer 42 provides data of even/odd numbered two paths, data from the SRDB, to the Latch 43 through the SDO, one of data paths, in response to an SRDB strobe signal from the database controlling unit 34 and the even/odd numbered signals from the FIFO unit 35. In this instance, the SRDB multiplexer fixes an order of forwarding the even/odd numbered signals in response to the even/odd numbered signal, which is a data forwarding order controlling signal, from the FIFO unit 35, and the first SRDB strobe signal is provided by a regular data forwarding and SRDB strobe signals thereafter are provided after the first and second Enable signals from the latency pipeline controlling unit 36 are activated. At each step of the data paths, first data are provided by interaction at each step when the first and second Enable signals are activated while the fist data are in storage according to given latencies. In providing the first and second Enable signals from the latency pipeline controlling unit 36, because there are modes in each of which a data is synchronized at a falling edge of an external clock, such as CL2.5, CL3.5, or CL4.5, the clock generating unit 33 generates a QCLK having a frequency two times of the external clock frequency, so that the latency pipeline controlling unit 36 provides the first and second Enable signals using the QCLK. As widths of the first and second SDO enable sections differs depending on a length of the burst, a read signal having information on the burst length is synchronized at the QCLK synchronizing unit 53 at first. The read signal provided in response to the DCLK which is the external clock delayed through the input buffer and an operational driver is activated on reception of a column access command, and disabled synchronized to the DCLK. Phases of the DCLK and QCLK may vary with required access times, or frequencies. In this instance, if the read signal is pipelined only in response to the QCLK, a first and a second enable section may vary. To avoid this, the read signal is synchronized to the DCLK once again as shown in FIG. 4 and a counter unit 54 is provided, which is triggered by the QCLK and stopped by an output from a toggle flipflop. The width of section fixed at the counter unit 54 is maintained the same as the read signal passes through the pipeline. The pipeline has a starting step varied with latency modes. In CL3, the read signal passes three flipflops. And, because the SRAM should stop a read command immediately when a write command or a precharge command is provided during a read operation, the data driver and the output buffer should not be in operation, that is made possible by disenabling the first and second Enable signals, for which a reset path of the reset unit 55 is provided in the latency pipeline controlling unit 36, to reset flipflops in the counter unit 54 and the pipe unit 56 on the same time, which resets, and disenables the first and second Enable signals.

FIGS. 5 to 9 illustrate pulse diagrams illustrating respective read operations of CL2, CL2.5, and CL3 when a burst has a length of 2, 4, and 8 respectively in a DDR SDRAM, and when respective read operations of CL2, CL2.5, and CL3 in the DDR SDRAM are stopped by write commands and by precharge commands, respectively. Each of the nodes 106 in FIGS. 5 to 7 is positioned on a line connecting the second NAND gate 64 to the seventh flipflop 73 illustrated in FIG. 7, and, in FIGS. 8 and 9, 'A' illustrate cases when the burst length is 8, 'B' when the burst length is 4, and 'C' when the burst length is 2, respectively. The SRDB latch forwards data only when an SRDB strobe signal is received from the database controlling unit 34, and stores data of a prior state in other cases. And, the Latch 43, positioned on the data pad side, receives an SDO valid signal from the database controlling unit 34, a first Enable signal from the latency pipeline controlling unit 36 and QCLK from the clock generating unit 33 and provides a driving signal for a data drive when an SDO signal is applied to a flipflop using the QCLK as a trigger pulse when the first Enable signal is activated. The output buffer of a CMOS push-pull form receives a data driver signal and forwards a data to the pad.

The operation of the DDR SDRAM of the present invention adapted to have two times of data band width in a desired latency mode exactly without addition of a frequency control signal even if a frequency is changed facilitated by providing the QCLK sync unit for receiving a read signal having information on a burst length and synchronizing to the QCLK and the counter unit for fixing intervals of the first and second Enable signals eliminates a necessity for cumbersome re-design of a circuit following a change of frequency to be used, allows easy application to a high data rate memory having 4 or 8 times data band width, and is applicable not only to the SDRAM, but also to all memories synchronous to a clock.

It will be apparent to those skilled in the art that various modifications and variations can be made in the semiconductor memory device of the present invention without departing from the spirit or scope of the invention. Thus, it is intended that the present invention cover the modifications and variations of this invention provided they come within the scope of the appended claims and their equivalents.

What is claimed is:

1. A semiconductor memory device comprising:
   a memory cell array having a plurality of memory cell regions for storing external data and forwarding the data on two lines by a decoded column address;
   a data path unit for receiving the data through the two lines and forwarding the data through one line synchronous to an edge of internal clock;
   a controlling unit for controlling the data path unit;
   a FIFO unit for controlling a forwarding order of the data received from the data path unit;
   a latency pipeline controlling unit for providing an Enable signal for setting a data output enable interval at each of the controlling unit and the data path unit;
   a clock generating unit for providing an internal clock to the FIFO unit, the data path unit and the latency pipeline controlling unit for obtaining a desired band width; and
   a burst counter for providing a read signal having information on a burst length to the FIFO unit and the latency pipeline controlling unit.

2. A semiconductor memory device comprising:
   a memory cell array having a plurality of memory cell regions for storing external data and forwarding the data on two lines by a decoded column address;
   a data path unit for receiving the data through the two lines and forwarding the data through one line synchronous to an edge of internal clock;
   a controlling unit for controlling the data path unit;
   a FIFO unit for controlling a forwarding order of the data received from the data path unit;
   a latency pipeline controlling unit for providing an Enable signal for setting a data output enable interval at each of the controlling unit and the data path unit;
   a clock generating unit for providing an internal clock to the FIFO unit, the data path unit and the latency pipeline controlling unit for obtaining a desired band width; and
   a burst counter for providing a read signal having information on a burst length to the FIFO unit and the latency pipeline controlling unit,
   wherein the latency pipeline controlling unit includes;
   a QCLK sync unit for receiving a read signal having information on a burst length and synchronizing to a QCLK,
   a counter unit for fixing intervals of Enable signals;
   a resetting unit for disabling the Enable signals when a read operation is stopped by a write command or a precharge command in the middle of the read command, and a pipe unit for receiving a latency mode signal and determining a start of the Enable signals according to a fixed mode.

3. A semiconductor memory device as claimed in claim 2, wherein the QCLK sync unit includes;

a flipflop for receiving a read signal, an Internal power normal signal indicating internal power normal signal, and the QCLK, and a NOR gate for receiving the read signal and an output signal from the flipflop.

4. A semiconductor memory device as claimed in claim 2, wherein the counter unit includes;

a first flipflop for receiving an output signal from a NOR gate in the QCLK sync unit inverted by an inverter, a DCLK, and an output signal from a first NAND gate inverted by a first inverter, a first NOR gate for receiving an output signal from the NOR gate in the QCLK sync unit inverted by the inverter and an output signal from the first flipflop, a second flipflop for receiving the QCLK, the output signal from the first NAND gate inverted by the first inverter, and an output signal from a second NAND gate inverted by a second inverter, the second NAND gate for receiving an output signal from the first NOR gate and an output signal from the second flipflop inverted by a third inverter, and the first NAND gate for receiving an output signal from the second NAND gate and an Internal power normal signal.

5. A semiconductor memory device as claimed in claim 2, wherein the resetting unit includes;

a NOR gate for receiving a PREBSCL, a precharging signal, and a WRITECL, a write signal, a flipflop for receiving an output signal from the NOR gate and the QCLK, and a NAND gate for receiving an Internal power normal signal and the WRITECL inverted by a first inverter.

6. A semiconductor memory device as claimed in claim 2, wherein the pipe unit includes;

a first flipflop for receiving the QCLK, an output signal from a NAND gate in the counter unit and an output signal from a NAND gate in the resetting unit inverted by an inverter, a first NAND gate for receiving an output signal from the first flipflop and a CL3, a second flipflop for receiving the QCLK, an Internal power normal signal, and an output signal form the first NAND gate inverted by a first inverter, a first AND gate for receiving an output signal from the first flipflop and a CL2.5, a first NOR gate for receiving an output signal from the first AND gate and an output signal from the second flipflop, a third flipflop for receiving the QCLK, WRITE_INTb, and an output signal from the first NOR gate inverted by a second inverter, a second AND gate for receiving the output signal from the first flipflop and a CL2, a second NOR gate for receiving an output signal from the second AND gate and an output signal from the third flipflop, a fourth flipflop for receiving the QCLK, WRITE_INTb, and an output signal from the second NOR gate inverted by a third inverter, a second NAND gate for receiving an output signal from the fourth flipflop and a read signal inverted by a fourth inverter and forwarding a second Enable signal to outside through a fifth and a sixth inverter, a third AND gate for receiving an output signal from the fourth flipflop and the read signal inverted by the fourth inverter, and a third NOR gate for receiving an output signal from the third AND gate and a DQM_DO, a signal for selectively masking a data the user want, and forwarding a first Enable signal to outside through a seventh and a eighth inverters.

7. A semiconductor memory device comprising:

a memory cell array having a plurality of memory cell regions, the memory cell array for storing external data and forwarding the data on two lines by a decoded column address;

a controlling unit for controlling an entire data path;

a plurality of main sense amplifiers for amplifying an output signal from the memory cell array and, on the same time, forwarding the output to two FRDBs in response to a main amplifier enable signal from the controlling unit;

FRDB latches in a number identical to a number of data pads each for storing an output signal from the main sense amplifier and forwarding the stored data to two SRDBs only in response to a FRDB strobe signal from the controlling unit;

SRDB latches for storing output signals from the FRDB latches and forwarding the stored data only in response to an SRDB strobe signal from the controlling unit;

an FIFO unit for controlling a forwarding order of the two data from each of the SRDB latches;

SRDB multiplexers for providing an output signal from each of the SRDB latch to the one SDO by the FIFO unit;

Latches for receiving an output signal from each of the SRDB multiplexers and an SDO valid signal from the controlling unit, storing the output signal from each of the SRDB multiplexer, and providing a high/low signal active signal;

output drivers/output buffers for receiving the high/low active signal from each of the Latches and forwarding an output data synchronous to an edge of an internal clock;

a latency pipeline controlling unit for providing an Enable signal that determines data output enable intervals at the controlling unit and the Latches;

a clock generating unit for providing the internal clock to the FIFO unit, the Latches, the output drivers/output buffers, and the latency pipeline controlling unit for obtaining a desired data band width; and, a burst counter for forwarding a read signal having information on a burst length to the FIFO unit and the latency pipeline controlling unit.

8. A semiconductor memory device as claimed in claim 7, wherein each of the Latches includes;

a first NOR gate for receiving an inverted first Enable signal and an inverted SDO valid signal, a first NAND gate for receiving the first Enable signal and an inverted SDO valid signal, a first flipflop for receiving an output signal from the first NOR gate and a QCLK, and a second flipflop for receiving an output signal from the first NAND gate and the QCLK.

9. A semiconductor memory device as claimed in claim 7, wherein the output driver includes;

a first inverter for inverting an UP, an output signal from a first flipflop, and a second inverter for inverting a DNb, an output signal from a second flipflop.

10. A semiconductor memory device as claimed in claim 7, wherein the output buffer includes;

a PMOS having a gate connected to an UPb, an output signal from a first inverter, and a source connected to a power source, and a NMOS having a gate connected to a DN, an output from a second inverter, a source connected to a ground, and a drain connected to a drain of the PMOS in common.

* * * * *